United States Patent
Yanagisawa et al.

(10) Patent No.: US 9,538,664 B2
(45) Date of Patent: Jan. 3, 2017

(54) WIRING SUBSTRATE

(71) Applicant: SHINKO ELECTRIC INDUSTRIES CO., LTD., Nagano-ken (JP)

(72) Inventors: Hiroharu Yanagisawa, Nagano (JP); Kentaro Kaneko, Nagano (JP); Kazuhiro Oshima, Nagano (JP); Junichi Nakamura, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 469 days.

(21) Appl. No.: 14/104,282

(22) Filed: Dec. 12, 2013

(65) Prior Publication Data
US 2014/0182920 A1 Jul. 3, 2014

(30) Foreign Application Priority Data
Dec. 27, 2012 (JP) .................. 2012-284418

(51) Int. Cl.
*H05K 1/11* (2006.01)
*H05K 3/00* (2006.01)
(Continued)

(52) U.S. Cl.
CPC .......... *H05K 3/0035* (2013.01); *H05K 3/0038* (2013.01); *H05K 3/421* (2013.01);
(Continued)

(58) Field of Classification Search
CPC .................. H05K 1/112–1/115; H05K 1/0366; H05K 3/035; H05K 3/421; H05K 3/429; H05K 3/4652; H05K 2201/096; H05K 2201/09827
(Continued)

(56) References Cited

U.S. PATENT DOCUMENTS 6,280,641 B1 8/2001 Gaku et al.
7,190,078 B2 * 3/2007 Khandekar ........... H01L 21/486
257/621
(Continued)

FOREIGN PATENT DOCUMENTS

JP 2000-183535 6/2000
JP 2009-088282 4/2009
(Continued)

OTHER PUBLICATIONS

Office Action; U.S. Appl. No. 14/038,190; Oct. 22, 2014; 12 pp.
(Continued)

*Primary Examiner* — Hoa C Nguyen
(74) *Attorney, Agent, or Firm* — Fish & Richardson P.C.

(57) ABSTRACT

A wiring substrate includes a first wiring layer with a wiring pattern and a metal foil. A first insulating layer includes a first through hole having a first end facing the metal foil and a second end. A second wiring layer includes a first opening having a diameter smaller than the second end. A second insulating layer includes a second through hole having a third end facing the wiring pattern and a fourth end. A third wiring layer includes a second opening having a diameter smaller than the fourth end. A first via is filled in the first opening, the first through hole, and a first recess, in the metal foil, having a diameter greater than the first end. A second via is filled in the second opening, the second through hole, and a second recess, in the wiring pattern, having a diameter greater than the third end.

4 Claims, 7 Drawing Sheets

(51) Int. Cl.
*H05K 3/42* (2006.01)
*H05K 1/03* (2006.01)
*H05K 3/34* (2006.01)
*H05K 3/40* (2006.01)
*H05K 3/46* (2006.01)

(52) U.S. Cl.
CPC ............ *H05K 3/427* (2013.01); *H05K 1/0366* (2013.01); *H05K 3/3436* (2013.01); *H05K 3/4007* (2013.01); *H05K 3/4652* (2013.01); *H05K 2201/096* (2013.01); *H05K 2201/09827* (2013.01); *H05K 2203/0346* (2013.01)

(58) Field of Classification Search
USPC .................................................. 174/262–266
See application file for complete search history.

(56) References Cited

U.S. PATENT DOCUMENTS

| | | | | |
|---|---|---|---|---|
| 8,188,380 | B2* | 5/2012 | Kawai | H05K 1/113 174/254 |
| 2004/0198053 | A1 | 10/2004 | Higuchi et al. | |
| 2007/0096328 | A1 | 5/2007 | Takahashi et al. | |
| 2007/0172984 | A1* | 7/2007 | Huang | H01L 21/76898 438/109 |
| 2008/0054462 | A1* | 3/2008 | Kim | H05K 3/38 257/738 |
| 2009/0236135 | A1 | 9/2009 | Ueda et al. | |
| 2009/0236138 | A1 | 9/2009 | Katagiri et al. | |
| 2010/0163297 | A1* | 7/2010 | Kajihara | H05K 3/0032 174/264 |
| 2010/0252318 | A1 | 10/2010 | Takahashi et al. | |
| 2010/0319966 | A1 | 12/2010 | Liu | |
| 2011/0097853 | A1 | 4/2011 | Kim et al. | |
| 2011/0155442 | A1 | 6/2011 | Yamada | |
| 2012/0005889 | A1 | 1/2012 | Takahashi et al. | |
| 2013/0313010 | A1* | 11/2013 | Rokugawa | H05K 1/0298 174/262 |
| 2014/0021625 | A1* | 1/2014 | Nakamura | H01L 23/145 257/773 |
| 2014/0097013 | A1* | 4/2014 | Hara | H01L 23/49822 174/266 |

FOREIGN PATENT DOCUMENTS

| | | |
|---|---|---|
| JP | 2009246357 | 10/2009 |
| JP | 2012156525 | 8/2012 |
| JP | 2013021306 | 1/2013 |
| WO | WO2011122246 | 10/2011 |

OTHER PUBLICATIONS

Office Action; U.S. Appl. No. 14/038,190; May 6, 2015; 12 pp.
Japanese Office Action with English Translation; JP-2012-284418; Jul. 5, 2016; 6 pages.

* cited by examiner

WIRING SUBSTRATE

CROSS-REFERENCE TO RELATED APPLICATIONS

This application is based upon and claims the benefit of priority from prior Japanese Patent Application No. 2012-284418, filed on Dec. 27, 2012, the entire contents of which are incorporated herein by reference.

FIELD

This disclosure relates to a wiring substrate and a method for manufacturing the wiring substrate.

BACKGROUND

Wiring substrates of various shapes and structures are used to mount components such as semiconductor chips and the like. The thinning and miniaturization of semiconductor chips has resulted in demands for a thinner and smaller wiring substrate used for the mounting of semiconductor chips. In the manufacturing of such a wiring substrate, filled vias, wirings, and the like are formed. Japanese Laid-Open Patent Publication No. 2009-88282 describes a method for manufacturing a printed wiring board using a laser via processing. One example of a method for forming the filled via and the wiring will now be described below.

As illustrated in FIG. 7A, a core material 90 including two opposite surfaces to which copper foils 91, 92 are adhered is first prepared. Then, in the step illustrated in FIG. 7B, a laser processing method is used to form an opening 92X in the copper foil 92 and to form a through hole 90X, which communicates with the opening 92X and extends through the core material 90 to expose the copper foil 91. When forming the opening 92X and the through hole 90X with the laser processing method, the laser processing proceeds faster in the core material 90 (resin layer) than in the copper foil 92. Thus, the through hole 90X of the core material 90 is formed extending into the lower side of the copper foil 92 from the opening 92X. In other words, an overhang structure is formed at the upper part of the through hole 90X. The overhang structure is a structure in which a projection 92A of the copper foil 92 projects to the inner side of the through hole 90X. Thereafter, the resin smear (resin residual) in the through hole 90X is removed through desmear processing.

Next, in the step illustrated in FIG. 7C, the projection 92A of the copper foil 92 is removed by etching and the like. In the step illustrated in FIG. 7D, a seed layer 93 is formed to cover the inner surfaces of the through hole 90X and the opening 92X and the exposed surfaces of the core material 91 and the copper foils 91, 92. In the step illustrated in FIG. 7E, an electrolytic plating method is performed using the seed layer 93 and the copper foil 91 as plating power supplying layers. This forms a filled via 94, which fills the through hole 90X and the opening 92X, a conductive layer 95, which covers the filled via 94 and the copper foil 92, and a conductive layer 96, which covers the entire lower surface of the copper foil 91. Further, in the step illustrated in FIG. 7E, the copper foil 92 and the conductive layer 95, as well as the copper foil 91 and the conductive layer 96 are patterned using a subtractive method and the like. This forms a wiring layer 97 on the upper surface of the core material 90 and forms a wiring layer 98 on the lower surface of the core material 90. As a result, the wiring layer 97 at the upper surface of the core material 90 is electrically connected to the wiring layer 98 at the lower surface of the core material 90 by the filled via 94.

In the manufacturing method described above, plating such as copper is deposited from the seed layer 93 formed on the inner surfaces of the through hole 90X and the opening 92X, so that the filled via 94 is filled in the through hole 90X. However, when an aspect ratio (depth/radius) of the through hole 90X is large, for example, when the through hole 90X is deep, the filling property of the plated film, that is, the filled via 94 degrades. Thus, a recess 99 may be easily formed at the surface of the filled via 94 (wiring layer 97) as illustrated in FIG. 7F.

SUMMARY

One aspect of the present invention is a wiring substrate. The wiring substrate includes a first wiring layer. The first wiring layer includes a first wiring pattern, a metal film that covers an entire upper surface of the first wiring pattern, and a first metal foil that covers an entire upper surface of the metal film. A first insulating layer is arranged on an upper surface of the first metal foil. The first insulating layer includes a first through hole. The first through hole includes a first open end facing the first metal foil and a second open end located at an opposite side of the first open end. An opening diameter of the first open end is smaller than an opening diameter of the second open end. A second wiring layer is arranged on an upper surface of the first insulating layer. The second wiring layer includes a second metal foil and a second wiring pattern arranged on an upper surface of the second metal foil. The second metal foil includes a first opening and a first projection. The first opening communicates with the first through hole and has an opening diameter smaller than the opening diameter of the second open end. The first projection projects toward an inner side from the second open end above the first through hole to define the first opening. A second insulating layer is arranged on a lower surface of the first insulating layer. The second insulating layer includes a second through hole. The second through hole includes a third open end facing the first wiring pattern and a fourth open end located at an opposite side of the third open end. An opening diameter of the third open end is smaller than an opening diameter of the fourth open end. A third wiring layer is arranged on a lower surface of the second insulating layer. The third wiring layer includes a third metal foil and a third wiring pattern arranged on a lower surface of the third metal foil. The third metal foil includes a second opening and a second projection. The second opening communicates with the second through hole and has an opening diameter smaller than the opening diameter of the fourth open end. The second projection projects toward an inner side from the fourth open end below the second through hole to define the second opening. A first via electrically connects the first wiring layer and the second wiring layer. The first via is filled in the first opening, the first through hole, and a first recess formed in the upper surface of the first metal foil. The first recess communicates with the first through hole and has an opening diameter greater than the opening diameter of the first open end. A second via electrically connects the first wiring layer and the third wiring layer. The second via is filled in the second opening, the second through hole, and a second recess formed in a lower surface of the first wiring pattern. The second recess communicates with the second through hole and has an opening diameter greater than the opening diameter of the third open end.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF THE EMBODIMENTS

Figure 1A:
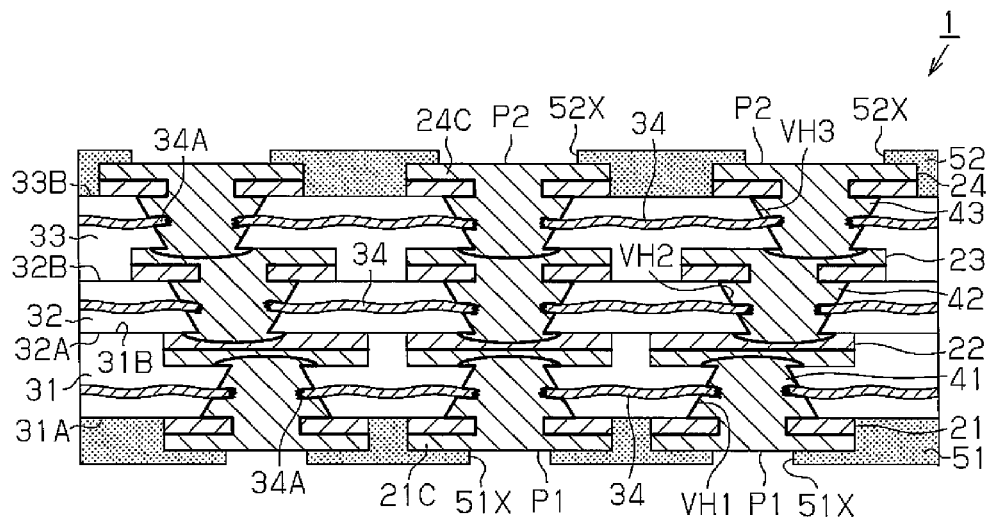
FIG. 1A is a schematic cross-sectional view illustrating a wiring substrate of one embodiment.

One embodiment will now be described with reference to the accompanying drawings. Elements in the drawings are illustrated for simplicity and clarity and have not necessarily been drawn to scale. In the cross-sectional views, hatching of some elements such as insulating layers is omitted and the hatching of some elements such as solder resist layer and other resist layers is changed to be shaded for clarity.

First, a structure of a wiring substrate 1 will now be described. As illustrated in FIG. 1A, the wiring substrate 1 includes a plurality of (four, for example, in the present embodiment) wiring layers 21, 22, 23, 24 and a plurality of (three, for example, in the present embodiment) insulating layers 31, 32, 33. The wiring layers 21 to 24 and the insulating layers 31 to 33 are alternately stacked. The wiring layers 21 to 24 are electrically connected to each other by vias 41 to 43 respectively arranged in the insulating layers 31 to 33.

The outermost (lowermost in FIG. 1A) wiring layer 21 is stacked on a lower surface 31A of the outermost (lowermost in FIG. 1A) insulating layer 31. The insulating layer 32 is stacked on an upper surface 31B of the insulating layer 31. The wiring layer 22 is stacked on a lower surface 32A of the insulating layer 32. The via 41 is filled in a through hole VH1 formed in the insulating layer 31. The wiring layers 21, 22 are electrically connected to each other by the via 41. The wiring layer 23 is stacked on an upper surface 32B of the insulating layer 32. The via 42 is filled in a through hole VH2 formed in the insulating layer 32. The wiring layers 22, 23 are electrically connected to each other by the via 42. The outermost (uppermost in FIG. 1A) insulating layer 33 is stacked on an upper surface 32B of the insulating layer 32. The outermost (uppermost in FIG. 1A) wiring layer 24 is stacked on an upper surface 33B of the insulating layer 33. The via 43 is filled in a through hole VH3 formed in the insulating layer 33. The wiring layers 23, 24 are electrically connected to each other by the via 43.

As the insulating layers 31 to 33, for example, glass epoxy resin obtained by curing thermosetting insulating resin having epoxy resin, which is impregnated in a glass cloth (glass woven cloth), as the main component may be used. The glass cloth is used as a reinforcement material. However, the thermosetting insulating resin is not limited to the epoxy resin, and for example, may be polyimide resin, cyanate resin, and the like. Each insulating layer 31 to 33 includes a given number (one in FIG. 1A) of glass cloth 34. For example, the glass cloth 34 has a structure in which glass fiber bundles arranged side by side in a first direction and glass fiber bundles arranged side by side in a second direction orthogonal to the first direction as viewed from above are plain woven to a lattice-form. Each glass fiber bundle is obtained by bundling a plurality of glass fibers. The diameter of each glass fiber is, for example, about 1 to 2 μm. The thickness of each glass fiber bundle is, for example, about 5 to 50 μm. Other than the glass cloth 34 using the glass fiber bundles, woven cloth or non-woven cloth using carbon fiber bundle, polyester fiber bundle, nylon fiber bundle, aramid fiber bundle, liquid crystal polymer (LCP) fiber bundle, and the like may be used for the reinforcement material. The weaving manner of the fiber bundles is not limited to plain weaving, and may be sateen weaving, twill weaving, and the like.

The glass cloth 34 arranged in each insulating layer 31 to 33 has an end 34A that extends through the inner wall surface of the corresponding through hole VH1 to VH3 and projects out into the corresponding through hole VH1 to VH3.

With the wiring layer 22 as a boundary, the stacking structure of the wiring layers and the insulating layers, and the structure of the via (through hole) differ between the upper side of the wiring layer 22 and the lower side of the wiring layer 22. First, the structure of the wiring layer 22 and the periphery of the wiring layer 22 will now be described.

Figure 1B:
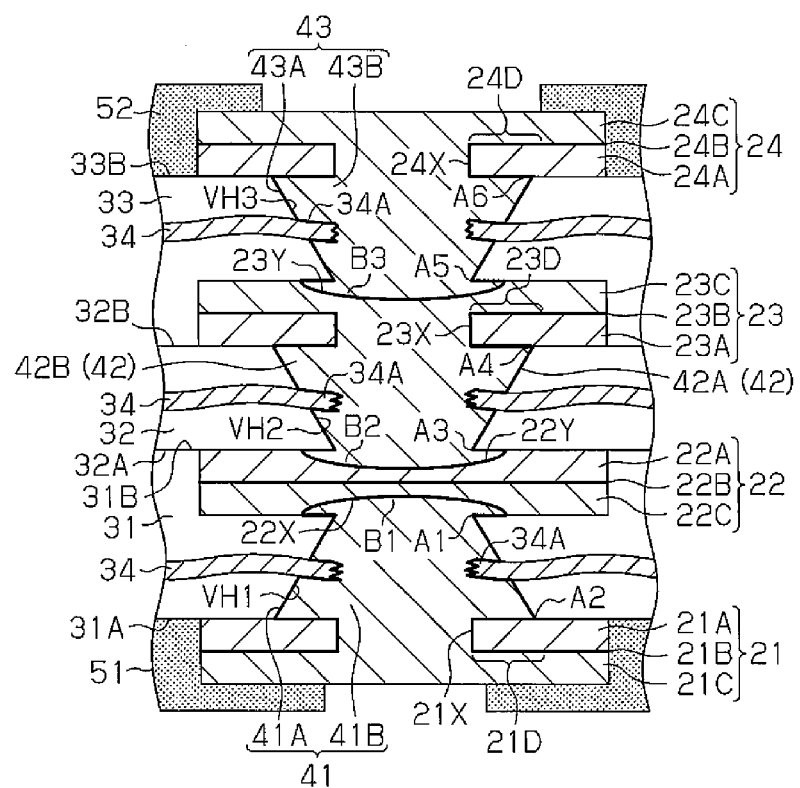
FIG. 1B is an enlarged cross-sectional view illustrating a part of the wiring substrate of FIG. 1A.

As illustrated in FIG. 1B, the wiring layer 22 includes a metal foil 22A, a metal film 22B, and a wiring pattern 22C. The metal foil 22A is formed on the lower surface 32A of the insulating layer 32. In FIG. 1B, the metal film 22B is illustrated with a thick line between the metal foil 22A and the wiring pattern 22C. The metal film 22B covers the entire lower surface of the metal foil 22A, and the wiring pattern 22C covers the entire lower surface of the metal film 22B. The wiring layer 22, as well as the insulating layer 31 that covers the wiring layer 22, are stacked on the lower surface 32A of the insulating layer 32. Thus, the upper surface of the wiring layer 22 (upper surface of the metal foil 22A) is covered by the insulating layer 32, and the lower surface of the wiring layer 22 (lower surface of the wiring pattern 22C) and the side surface of the wiring layer 22 are covered by the insulating layer 31.

The material of the metal foil 22A, the metal film 22B, and the wiring pattern 22C may be, for example, copper (Cu) or copper alloy. The material of the metal foil 22A may be the same as or different from the material of the wiring pattern 22C. For example, a metal multilayer film obtained by stacking a metal barrier film using tantalum nitride (TaN), tantalum (Ta), chromium (Cr), titanium (Ti), or the like, and a metal film using copper or copper alloy may be used for the metal film 22B. The thickness of the metal foil 22A is, for example, about 6 μm. The thickness of the metal film 22B is, for example, about 0.5 to 1 μm. The thickness of the wiring pattern 22C is, for example, about 14 to 29 μm. The thickness from the lower surface of the wiring pattern 22C to the lower surface 31A of the insulating layer 31 is, for example, about 40 to 60 μm.

A given number (one herein) of insulating layer 31 and a given number (one herein) of wiring layer 21 are stacked on the lower side of the wiring layer 22. In the present example, the insulating layer 31 that covers the lower surface and the side surface of the wiring layer 22 is stacked on the lower surface of the insulating layer 32, and the wiring layer 21 is stacked on the lower surface of the insulating layer 31.

The through hole VH1 that extends through the insulating layer 31 in the thickness direction is formed at a given area (three areas in FIG. 1A) of the insulating layer 31. The through hole VH1 is tapered such that the diameter reduces from the lower side (wiring layer 21) toward the upper side (wiring layer 22) in FIG. 1B. In other words, the through hole VH1 is formed to have a circular truncated cone shape and includes an open end A1 facing the wiring layer 22 and an open end A2 facing the wiring layer 21. The open end A2 has an opening diameter greater than the opening diameter of the open end A1. A recess 22X formed at the lower surface of the wiring pattern 22C of the wiring layer 22 is exposed from the open end A1 of the through hole VH1.

The recess 22X communicates with the through hole VH1. The recess 22X extends from the lower surface of the wiring pattern 22C to a halfway position in the thickness direction of the wiring pattern 22C. In other words, the recess 22X includes a bottom surface located halfway in the thickness direction of the wiring pattern 22C. Thus, the recess 22X does not extend through the wiring pattern 22C. The recess 22X has an opening diameter greater than the opening diameter of the open end A1 of the through hole VH1. Therefore, the outermost edge of the inner surface of the recess 22X is located at the outer side than the innermost edge of the inner wall surface of the through hole VH1. Thus, the outer edge of the recess 22X extends from the open end A1 of the through hole VH1 to the upper surface of the insulating layer 31. That is, the recess 22X exposes the upper surface of the insulating layer 31 contacting the upper end of the inner wall surface of the through hole VH1.

The recess 22X is formed, for example, to have a substantially semi-elliptical cross-section. The depth of the recess 22X is, for example, about 2 to 3 μm. The opening diameter of the open end A1 of the through hole VH1 is, for example, about 50 to 80 μm. The opening diameter of the recess 22X is, for example, about 60 to 90 μm.

The wiring layer 21 includes a metal foil 21A, a metal film 21B, and a wiring pattern 21C. The metal foil 21A is formed on the lower surface 31A of the insulating layer 31. In FIG. 1B, the metal film 21B is illustrated with a thick line between the metal foil 21A and the wiring pattern 21C. The metal film 21B covers the entire lower surface of the metal foil 21A, and the wiring pattern 21C covers the entire lower surface of the metal film 21B and the entire lower surface of the via 41.

The material of the metal foil 21A and the wiring pattern 21C may be, for example, copper or copper alloy. The material of the metal foil 21A may be the same as or different from the material of the wiring pattern 21C. The same material as the metal film 22B may be used as the material of the metal film 21B. The thickness of the metal foil 21A is, for example, about 6 to 12 μm. The thickness of the metal film 21B is, for example, about 0.5 to 1 μm. The thickness of the wiring pattern 21C is, for example, about 14 to 29 μm.

An opening 21X that communicates with the through hole VH1 is formed in the metal foil 21A. The opening 21X has an opening diameter smaller than the opening diameter of the open end A2 of the through hole VH1. Thus, the open end A2 of the through hole VH1 extends to the outer side from the opening 21X of the metal foil 21A. In other words, the metal foil 21A includes a projection 21D that projects toward the inner side from the open end A2 below the through hole VH1. The projection 21D has a ring shape. The opening diameter of the open end A2 of the through hole VH1 is, for example, about 75 to 90 μm. The opening diameter of the opening 21X is, for example, about 75 to 100 μm.

The via 41 formed on the lower surface side of the wiring layer 22 is filled in the recess 22X, the through hole VH1, and the opening 21X. The portion of the via 41 filled in the recess 22X serves as a bottom B1 of the via 41, which bottom B1 is joined to the wiring pattern 22C at a position on the upper side than the lower surface of the wiring pattern 22C. The portion of the via 41 filled in the through hole VH1 is tapered such that the diameter reduces from the lower side (wiring layer 21) toward the upper side (wiring layer 22) in FIG. 1B. The portion of the via 41 filled in the opening 21X has a diameter smaller than the diameter of the lower end of the via 41 filled in the through hole VH1. The via 41 covers the entire surface of the end 34A of the glass cloth 34 extending through the inner wall surface of the through hole VH1.

The via 41 includes a metal film 41A (see thick line) and a conductive layer 41B. The metal film 41A covers the side surface and the upper surface of the projection 21D of the metal foil 21A, the entire inner wall surface of the through hole VH1, the entire surface of the end 34A of the glass cloth 34 extending through the inner wall surface of the through hole VH1, the entire inner surface of the recess 22X, and the upper surface of the insulating layer 31 exposed in the recess 22X. The conductive layer 41B is filled in the opening 21X, the through hole VH1, and the recess 22X on the inner side than the metal film 41A. In the present example, the via 41 is integrally formed with the wiring pattern 21C. Furthermore, in the present example, the metal film 41A is integrally formed with the metal film 21B. Thus, the metal films 21B, 41A continuously cover the lower surface of the metal foil 21A, the side surface and the upper surface of the projection 21D, the entire inner wall surface of the through hole VH1, the entire surface of the end 34A of the glass cloth 34, the upper surface of the insulating layer 31 exposed in the recess 22X, and the entire inner surface of the recess 22X. The same material as the metal film 21B may be used as the material of the metal film 41A. Copper or copper alloy, for example, may be used as the material of the conductive layer 41B.

A space including the recess 22X and the through hole VH1 is defined such that the innermost edge of the inner wall surface of the through hole VH1 projects toward the inner side from the outermost edge of the inner surface of the recess 22X. Thus, a step is formed by the inner wall surface of the through hole VH1, the upper surface of the insulating layer 31 exposed in the recess 22X, and the inner surface of the recess 22X. When the via 41 is filled in the space including such s step, the via 41 extends to the upper surface of the insulating layer 31 exposed in the recess 22X. Thus, the bottom B1 of the via 41 has the shape of a nail head or a screw head, and the lower surface of the peripheral edge of the bottom B1 contacts the upper surface of the insulating layer 31. A space including the through hole VH1 and the opening 21X is defined such that the projection 21D is arranged below the through hole VH1. Thus, a step is formed by the inner wall surface of the through hole VH1 and the upper surface and the side surface of the projection 21D. When the via 41 is filled in the space including such a step, the via 41 extends to the upper surface of the metal foil 21A (projection 21D) exposed in the through hole VH1. Thus, the lower surface of the peripheral edge of the via 41 filled in the through hole VH1 contacts the upper surface of the projection 21D.

In the present example, one wiring layer 21 and one insulating layer 31 are stacked on the lower side of the wiring layer 22, but two or more wiring layers and two or more insulating layers may be stacked on the lower side of the wiring layer 22. For example, when two wiring layers and two insulating layers are formed on the lower side of the wiring layer 22, the wiring layer 22 is replaced with an additional wiring layer having the same structure as the wiring layer 23. An additional via having an inverted circular truncated cone shape to be connected to the additional wiring layer is formed in an additional insulating layer that covers the additional wiring layer. The additional via has the same structure as the via 42. The wiring layer 22 to be connected to the additional via, the insulating layer 31 that covers the wiring layer 22, the via 41 to be connected to the wiring layer 22, and the wiring layer 21 to be connected to the via 41 are formed on the lower surface of the additional insulating layer.

As illustrated in FIG. 1B, a given number (two herein) of insulating layers 32, 33 and a given number (two herein) of wiring layer 23, 24 are stacked on the upper side of the wiring layer 22. The insulating layer 32 that covers the upper surface of the wiring layer 22 is stacked on the upper surface 31B of the insulating layer 31. The wiring layer 23 is stacked on the upper surface 32B of the insulating layer 32.

The through hole VH2 that extends through the insulating layer 32 in the thickness direction is formed at a given area (three areas in FIG. 1A) of the insulating layer 32. The through hole VH2 is tapered such that the diameter reduces from the upper side (wiring layer 23) toward the lower side (wiring layer 22) in FIG. 1B. In other words, the through hole VH2 is formed to have an inverted circular truncated cone shape and includes an open end A3 facing the wiring layer 22 and an open end A4 facing the wiring layer 23. The open end A4 has an opening diameter greater than the opening diameter of the open end A3.

In this manner, the through hole VH2 having an inverted circular truncated cone shape is formed on the upper surface side of the wiring layer 22, whereas the through hole VH1 having a circular truncated cone shape is formed on the lower surface side of the wiring layer 22.

The recess 22Y formed at the upper surface of the metal foil 22A of the wiring layer 22 is exposed from the open end A3 of the through hole VH2. Thus, the recess 22Y communicates with the through hole VH2. The recess 22Y extends from the upper surface of the metal foil 22A to a halfway position in the thickness direction of the metal foil 22A. In other words, the recess 22Y includes a bottom surface located halfway in the thickness direction of the metal foil 22A. Thus, the recess 22Y does not extend through the metal foil 22A. The recess 22Y has an opening diameter greater than the opening diameter of the open end A3 of the through hole VH2. Therefore, the outermost edge of the inner surface of the recess 22Y is located at the outer side than the innermost edge of the inner wall surface of the through hole VH2. Thus, the outer edge of the recess 22Y extends from the open end A3 of the through hole VH2 to the lower surface 32A of the insulating layer 32. That is, the recess 22Y exposes the lower surface 32A of the insulating layer 32 contacting the lower end of the inner wall surface of the through hole VH2.

The recess 22Y is formed, for example, to have a substantially semi-elliptical cross-section, for example. The depth of the recess 22Y is, for example, about 2 to 3 µm. The opening diameter of the open end A3 of the through hole VH2 is, for example, about 50 to 80 µm. The opening diameter of the recess 22Y is, for example, about 60 to 90 µm.

The wiring layer 23 includes a metal foil 23A, a metal film 23B, and a wiring pattern 23C. The metal foil 23A is formed on the upper surface 32B of the insulating layer 32. In FIG. 1B, the metal film 23B is illustrated with a thick line between the metal foil 23A and the wiring pattern 23C. The metal film 23B covers the entire upper surface of the metal foil 23A, and the wiring pattern 23C covers the entire upper surface of the metal film 23B and the entire upper surface of the via 42.

The material of the metal foil 23A and the wiring pattern 23C may be, for example, copper or copper alloy. The material of the metal foil 23A may be the same as or different from the material of the wiring pattern 23C. The same material as the metal film 22B may be used as the material of the metal film 23B. The thickness of the metal foil 23A is, for example, about 6 to 12 µm. The thickness of the metal film 23B is, for example, about 0.5 to 1 µm. The thickness of the wiring pattern 23C is, for example, about 14 to 29 µm.

An opening 23X that communicates with the through hole VH2 is formed in the metal foil 23A. The opening 23X has an opening diameter smaller than the opening diameter of the open end A4 of the through hole VH2. Thus, the through hole VH2 of the insulating layer 32 extends to the outer side from the opening 23X of the metal foil 23A. In other words, the metal foil 23A includes a projection 23D that projects toward the inner side from the open end A4 above the through hole VH2. The projection 23D has a ring shape. The opening diameter of the open end A4 of the through hole VH2 is, for example, about 75 to 90 µm. The opening diameter of the opening 23X is, for example, about 75 to 100 µm.

The via 42 formed on the upper surface side of the wiring layer 22 is filled in the recess 22Y, the through hole VH2, and the opening 23X. The portion of the via 42 filled in the recess 22Y serves as a bottom B2 of the via 42, which bottom B2 is joined to the metal foil 22A at a position on the lower side than the upper surface of the metal foil 22A. The portion of the via 42 filled in the through hole VH2 is tapered such that the diameter reduces from the upper side (wiring layer 23) toward the lower side (wiring layer 22) in FIG. 1B. The portion of the via 42 filled in the opening 23X has a diameter smaller than the diameter of the upper end of the via 42 filled in the through hole VH2. The via 42 covers the entire surface of the end 34A of the glass cloth 34 extending through the inner wall surface of the through hole VH2.

The via 42 includes a metal film 42A (see thick line) and a conductive layer 42B. The metal film 42A covers the side surface and the lower surface of the projection 23D of the metal foil 23A, the entire inner wall surface of the through hole VH2, the entire surface of the end 34A of the glass cloth 34 extending through the inner wall surface of the through hole VH2, the entire inner surface of the recess 22Y, and the lower surface 32A of the insulating layer 32 exposed in the recess 22Y. The conductive layer 42B is filled in the opening 23X, the through hole VH2, and the recess 22Y on the inner side than the metal film 42A. In the present example, the via 42 is integrally formed with the wiring pattern 23C. Furthermore, in the present example, the metal film 42A is integrally formed with the metal film 23B. Thus, the metal films 23B, 42A continuously cover the upper surface of the metal foil 23A, the side surface and the lower surface of the projection 23D, the entire inner wall surface of the through hole VH2, the entire surface of the end 34A of the glass cloth 34, the lower surface 32A of the insulating layer 32 exposed in the recess 22Y, and the entire inner surface of the recess 22Y. The same material as the metal film 23B may be used as the material of the metal film 42A. Copper or copper alloy, for example, may be used as the material of the conductive layer 42B.

A space including the recess 22Y and the through hole VH2 is defined such that the innermost edge of the inner wall surface of the through hole VH2 projects toward the inner side from the outermost edge of the inner surface of the recess 22Y. Thus, a step is formed by the inner wall surface of the through hole VH2, the lower surface 32A of the insulating layer 32 exposed in the recess 22Y, and the inner surface of the recess 22Y. When the via 42 is filled in the space including such a step, the via 42 extends to the lower surface 32A of the insulating layer 32 exposed in the recess 22Y. Thus, the bottom B2 of the via 42 has the shape of a nail head or a screw head, and the upper surface of the peripheral edge of the bottom B2 contacts the lower surface 32A of the insulating layer 32. A space including the through hole VH2 and the opening 23X is defined such that the projection 23D is arranged above the through hole VH2. Thus, a step is formed by the inner wall surface of the through hole VH2 and the lower surface and the side surface of the projection 23D. When the via 42 is filled in the space including such a step, the via 42 extends to the upper surface of the metal foil 23A (projection 23D) exposed in the through hole VH2. Thus, the upper surface of the peripheral edge of the via 42 filled in the through hole VH2 contacts the lower surface of the projection 23D.

As described above, the recess 22Y is formed at the upper surface of the metal foil 22A of the wiring layer 22. The recess 22X is formed at the lower surface of the wiring pattern 22C formed on the lower surface of the metal foil 22A via the metal film 22B. The recesses 22X, 22Y are not communicated with each other in the wiring layer 22. In other words, the recess 22X is spaced apart from the recess 22Y by the metal film 22B. The recess 22Y is formed at the metal foil 22A formed on the upper surface of the metal film 22B, and the recess 22X is formed at the wiring pattern 22C formed on the lower surface of the metal film 22B. Thus, the recess 22X does not contact the recess 22Y.

The insulating layer 33, the via 43, and the wiring layer 24 are formed on the upper side of the wiring layer 22. The insulating layer 33 has the same structure as the insulating layer 32 covering the upper surface of the metal foil 22A. The via 43 has the same structure as the via 42 formed in the insulating layer 32 and having the inverted circular truncated cone shape. The wiring layer 24 has the same structure as the wiring layer 23 formed on the upper surface 32B of the insulating layer 32 and connected to the via 42.

The insulating layer 33 is stacked on the upper surface 32B of the insulating layer 32 and covers the upper surface and the side surface of the wiring layer 23. The wiring layer 24 stacked on the upper surface 33B of the insulating layer 33 includes a metal foil 24A, a metal film 24B, and a wiring pattern 24C.

The through hole VH3 formed in the insulating layer 33 is tapered such that the diameter reduces from the upper side (wiring layer 24) toward the lower side (wiring layer 23) in FIG. 1B. In other words, the through hole VH3 is formed to have an inverted circular truncated cone shape and includes an open end A5 facing the wiring layer 23 and an open end A6 facing the wiring layer 24. The open end A6 has an opening diameter greater than the opening diameter of the open end A5. A recess 23Y formed at the upper surface of the wiring pattern 23C is exposed from the open end A5 of the through hole VH3. The recess 23Y communicates with the through hole VH3, and has an opening diameter greater than the opening diameter of the open end A5 of the through hole VH3.

The via 43 includes a metal film 43A and a conductive layer 43B, and is filled in the opening 24X, the through hole VH3, and the recess 23Y. The portion of the via 43 filled in the recess 23Y serves as a bottom B3 of the via 43. The bottom B3 has the shape of a nail head or a screw head, and the upper surface of the peripheral edge of the bottom B3 contacts the lower surface of the insulating layer 33 exposed in the recess 23Y.

As illustrated in FIG. 1A, the solder resist layer 51 is stacked on the lower surface 31A of the insulating layer 31. An insulating resin such as epoxy resin, for example, may be used as the material of the solder resist layer 51. The solder resist layer 51 includes an opening 51X for exposing part of the wiring pattern 21C of the wiring layer 21 as a pad P1. The pad P1 is flip-chip connected with a bump 11 (see FIG. 2) of the semiconductor chip 10 mounted on the wiring substrate 1. In other words, a lower side surface of the wiring substrate 1 formed with the pad P1 is used as a chip mounting surface.

An OSP (Organic Solderbility Preservative) film may be formed on the wiring pattern 21C exposed from the opening 51X by performing the OSP processing, as necessary. In this case, the semiconductor chip 10 is connected to the OSP film. A metal layer may be formed on the wiring pattern 21C exposed from the opening 51X, and the semiconductor chip 10 may be connected to the metal layer. An example of the metal layer includes a gold (Au) layer, a nickel (Ni)/Au layer (metal layer in which Ni layer and Au layer are stacked in this order on the wiring pattern 22), an Ni/palladium (Pd)/Au layer (metal layer in which Ni layer, Pd layer, and Au layer are stacked in this order on the wiring pattern 22), or the like.

In the same manner, the solder resist layer 52 is stacked on the upper surface 33B of the insulating layer 33. An insulating resin such as epoxy resin, for example, may be used as the material of the solder resist layer 52. The solder resist layer 52 includes an opening 52X for exposing part of the wiring pattern 24C of the wiring layer 24 as an external connection pad P2. An external connection terminal such as a solder ball, lead pin, and the like used when mounting the wiring substrate 1 on the mounting substrate such as the motherboard, for example, is connected to the external connection pad P2. The OSP film may be formed on the wiring pattern 24C exposed from the opening 52X by performing the OSP processing, as necessary. In this case, the external connection terminal is connected to the OSP film. Furthermore, a metal layer may be formed on the wiring pattern 24C exposed from the opening 52X, and the external connection terminal may be connected to the metal layer. An example of the metal layer includes an Au layer, an Ni/Au layer, an Ni/Pd/Au layer, or the like. The wiring pattern 24C exposed from the opening 52X may be used as the external connection terminal. Alternatively, when the OSP film or the metal layer is formed on the wiring pattern 24C, such OSP film or the metal layer may be used as the external connection terminal.

A structure of the semiconductor device 2 will now be described.

Figure 2:
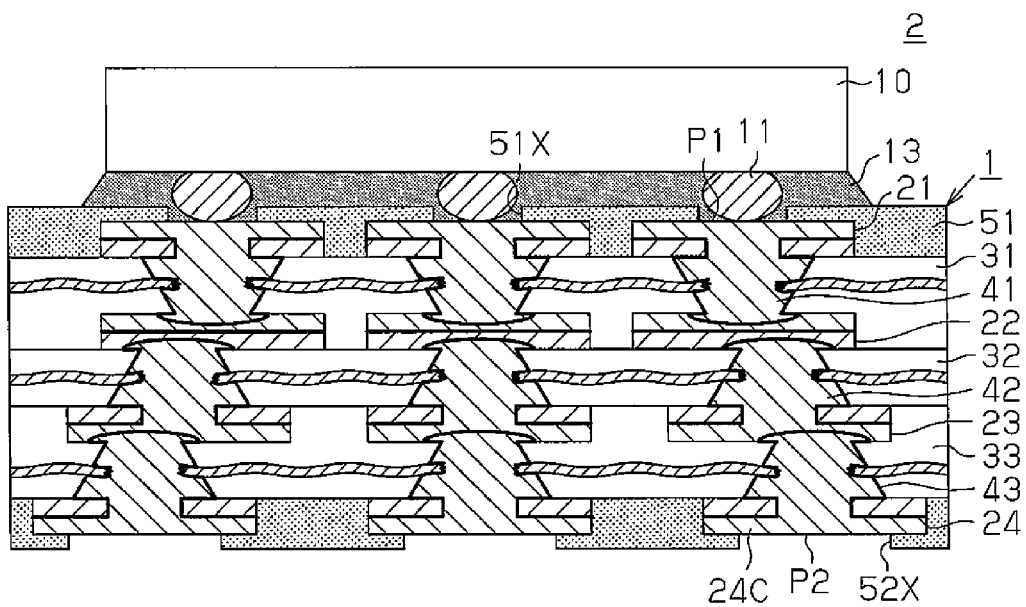
FIG. 2 is a schematic cross-sectional view illustrating a semiconductor device including the wiring substrate of FIG. 1A.

As illustrated in FIG. 2, the semiconductor device 2 includes the wiring substrate 1, the semiconductor chip 10, and an underfill resin 13. In FIG. 2, the wiring substrate 1 is turned upside down from FIG. 1A.

The semiconductor chip 10 is flip-chip mounted on the wiring substrate 1. In other words, the bump 11 arranged on a circuit forming surface (lower surface in FIG. 2) of the semiconductor chip 10 is joined with the pad P1 of the wiring substrate 1, so that the semiconductor chip 10 is joined to the wiring substrate 1 face down. The semiconductor chip 10 is electrically connected to the pad P1 of the wiring substrate 1 via the bump 11.

A logic chip such as a central processing unit (CPU) chip, a graphics processing unit (GPU) chip, and the like, for example, may be used for the semiconductor chip 10. A memory chip such as a dynamic random access memory (DRAM) chip, a static random access memory (SRAM) chip, a flash memory chip, and the like, for example, may also be used for the semiconductor chip 10. The size of the semiconductor chip 10 is, for example, about 3 mm×3 mm to 12 mm×12 mm as viewed from above. The thickness of the semiconductor chip 10 is, for example, about 50 to 100 μm.

A gold bump or a solder bump, for example, may be used for the bump 11. As the material of the solder bump, for example, an alloy containing lead (Pb), an alloy of tin (Sn) and Au, an alloy of Sn and Cu, an alloy of Sn and Ag, an alloy of Sn, Ag, and Cu, and the like, may be used.

The underfill resin 13 is arranged to fill the gap between the upper surface of the wiring substrate 1 and the lower surface of the semiconductor chip 10. The underfill resin 13 enhances the connection strength of the connecting portion of the bump 11 and the pad P1, and also prevents corrosion of the wiring pattern 22C, occurrence of electromigration, and lowering in reliability of the wiring pattern 22C. The insulating resin such as epoxy resin, for example, may be used as the material of the underfill resin 13.

The operations of the wiring substrate 1 and the semiconductor device 2 will now be described.

The projection 23D projecting toward the inner side from the open end A4 of the through hole VH2 above the through hole VH2 is formed on the metal foil 23A. In other words, the opening 23X that communicates with the through hole VH2 and has an opening diameter smaller than the opening diameter of the open end A4 is formed in the metal foil 23A. The via 42 is formed in the space including the through hole VH2 and the opening 23X. The space is defined by the step formed by the side surface and the lower surface of the projection 23D and the inner wall surface of the through hole VH2. Thus, the via 42 filled in the through hole VH2 extends to the lower surface of the projection 23D. This enhances the adhesiveness of the via 42 and the insulating layer 32. As a result, high adhesiveness may be maintained with respect to the tension force caused by the difference in thermal expansion coefficients of the via 42 and the insulating layer 32. Therefore, the via 42 may be suppressed from falling out from the through hole VH2.

The via 42 is filled in the through hole VH2 and the recess 22Y having an opening diameter greater than the open end A3 of the through hole VH2. Therefore, the bottom B2 of the via 42 extends to the lower surface 32A of the insulating layer 32. This enhances the adhesiveness of the via 42 and the insulating layer 32. As a result, high adhesiveness may be maintained with respect to the tension force caused by the difference in thermal expansion coefficient of the via 42 and the insulating layer 32. Therefore, the via 42 may be further suppressed from falling out from the through hole VH2.

Further, the via 42 covers the entire surface of the end 34A of the glass cloth 34 extending through the inner wall surface of the through hole VH2. In other words, the end 34A of the glass cloth 34 projects into the via 42 from the inner wall surface of the through hole VH2. Thus, the tensile strength of the via 42 becomes high. This may enhance the connection reliability of the via 42 and the insulating layer 32.

The method for manufacturing the wiring substrate 1 will now be described.

Figure 3A:
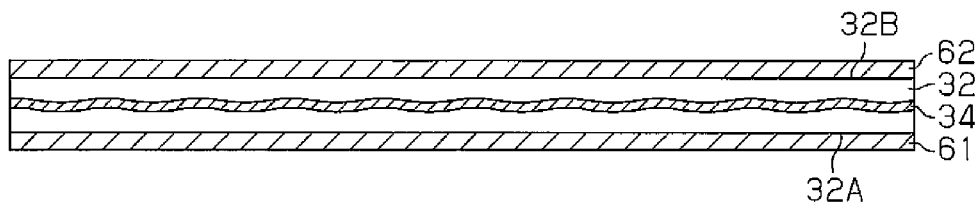
FIGS. 3A to 3E, 4A to 4D, 5A to 5C, and 6A to 6C are schematic cross-sectional views illustrating a method for manufacturing the wiring substrate of FIG. 1A.

As illustrated in FIG. 3A, a copper clad laminate (CCL) substrate is first prepared. The CCL substrate includes a metal foil 61 placed on the lower surface 32A of the insulating layer 32, and a metal foil 62 placed on the upper surface 32B of the insulating layer 32. The insulating layer 32 includes the glass cloth 34. The metal foils 61, 62 are used as base materials of the metal foils 22A, 23A, respectively, and are copper foils, for example.

The pre-processing of laser processing is then performed on the metal foil 62. In this step, roughening processing, blackening processing, and the like are performed on the metal foil 62, for example. According to such processing, the metal foil 62 tends to easily absorb laser light when the metal foil 62 is irradiated with the laser light in the next step illustrated in FIG. 3B so that hole drilling may be efficiently performed.

Figure 3B:
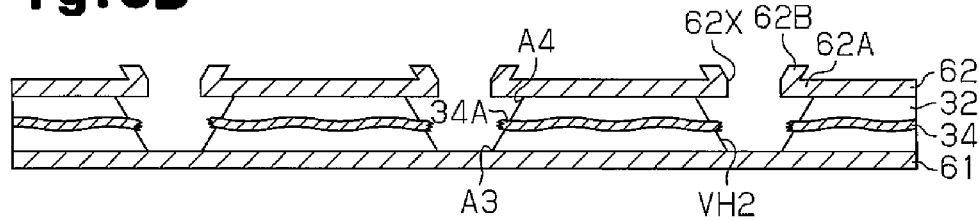

In the step illustrated in FIG. 3B, an opening 62X is formed in the metal foil 62 and the through hole VH2 that extends through the insulating layer 32 in the thickness direction is formed using the laser processing method by $CO_2$ laser, UV-YAG laser, and the like. The through hole VH2 communicates with the opening 62X and exposes the upper surface of the metal foil 61. The through hole VH2 is formed to have an inverted circular truncated cone shape and includes the open end A3 facing the metal foil 61 and the open end A4 facing the metal foil 62. The open end A4 has an opening diameter greater than the opening diameter of the open end A3. In this case, the laser processing proceeds faster in the insulating layer 32 than in the metal foil 62 (copper foil). The insulating layer 32 is easily subjected to the influence of heat of the laser. Thus, the through hole VH2 extends from the opening 62X to the lower surface of the metal foil 62 as illustrated in FIG. 3B. As a result, the metal foil 62 projects to the inner side of the through hole VH2 in a ring shape and thereby forms a projection 62A. That is, an overhang structure of the metal foil 62 is formed above the through hole VH2. The opening 62X of the metal foil 62 has an opening diameter smaller than the opening diameter of the open end A4 of through hole VH2. When the opening 62X is formed in the metal foil 62 by irradiating the laser light, the copper sublimated by laser reattaches to the metal foil 62 (projection 62A) in the vicinity of the opening 62X and thereby forms a burr 62B. When the through hole VH2 is formed by the laser processing method, the end 34A of the glass cloth 34 cut by the laser projects out from the inner wall surface of the through hole VH2. The surface roughness of the end 34A of the glass cloth 34 is greater than the surface roughness of the inner wall surface (resin portion) of the through hole VH2.

Figure 3C:
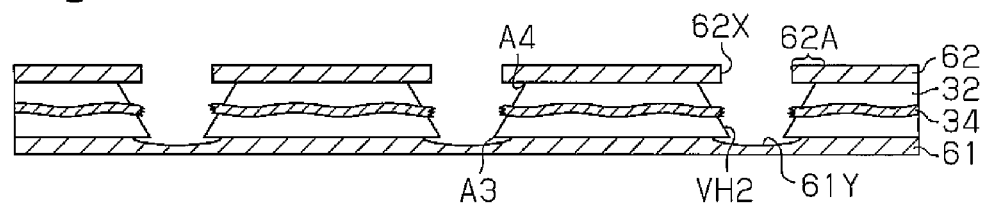

In the step illustrated in FIG. 3C, the post-processing of the laser processing is performed on the structural body of FIG. 3B. In this step, the etching processing is performed on the structural body of FIG. 3B so as to remove the burr 62B of the projection 62A and form a recess 61Y at the upper surface of the metal foil 61. For example, a resist layer (not illustrated) is formed on the upper surface of the metal foil 62 to expose the opening 62X and the burr 62B of the metal foil 62. Further, a resist layer (not illustrated) that covers the entire lower surface of the metal foil 61 is formed. The metal foils 61, 62 are etched using the resist layers as the etching masks. In such etching processing, the end of the projection 62A may be removed with the burr 62B, and the opening diameter of the opening 62X may become wider. The etching processing may be performed by wet etching, for example. When the wet etching is performed on the metal foil 61, the side etch phenomenon in which the etching advances in the in-plane direction of the metal foil 61 occurs. According to such side etch phenomenon, the recess 61Y that communicates with the through hole VH2 and extends to the lower surface of the insulating layer 32 is formed at the upper surface of the metal foil 61. The recess 61Y has an opening diameter greater than the opening diameter of the open end A3 of the through hole VH2.

Figure 3D:
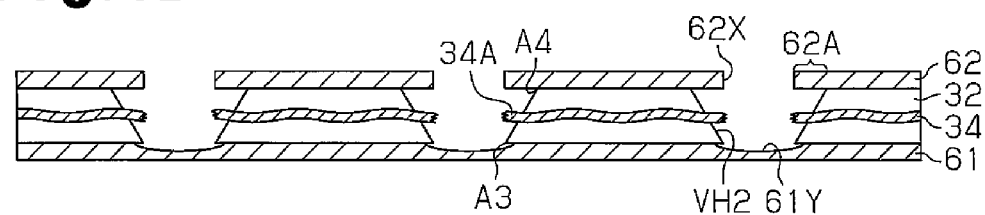

In the step illustrated in FIG. 3D, the desmear processing is performed to remove the resin smear (resin residual) in the through hole VH2 and to etch the inner wall of the insulating layer 32 defining the inner wall surface of the through hole VH2. The opening diameter of the through hole VH2 thus widens. That is, the opening diameters of the open ends A3, A4 are respectively made wider than the opening diameters of the open ends A3, A4 illustrated in FIG. 3C. This increases the projection amount of the projection 62A of the metal foil 62, as well as the projection amount of the end 34A of the glass cloth 34 projecting to the inner side through the inner wall surface of the through hole VH2. In the present example, the opening diameters of the open ends A3, A4 become substantially the same size as the opening diameters of the open ends A3, A4 illustrated in FIG. 1A by the desmear processing. The desmear processing may be performed using, for example, permanganate process.

Figure 3E:
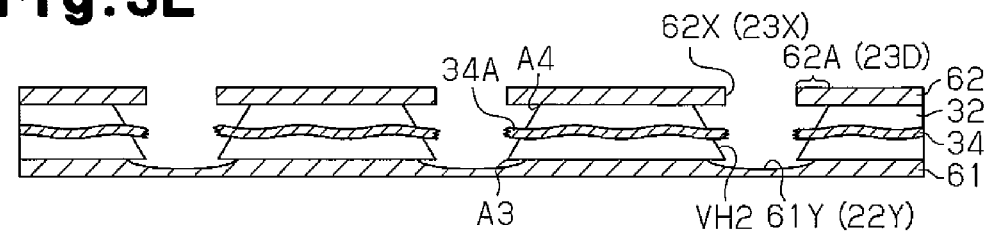

In the step illustrated in FIG. 3E, the etching processing is performed on the structural body of FIG. 3D. In the present example, the etching processing is performed to widen the opening diameter of the recess 61Y formed in the step illustrated in FIG. 3C. The etching processing may be performed, for example, by wet etching. When the wet etching is performed on the metal foil 61, the side etch phenomenon in which the etching advances in the in-plane direction of the metal foil 61 occurs, and the opening diameter of the recess 61Y widens. Thus, compared to the structural body illustrated in FIG. 3D, the amount at which the recess 61Y extends to the lower surface of the insulating layer 32 increases. In the step of FIG. 3E, the etching processing is performed to leave the projection 62A of the metal foil 62. Specifically, a resist layer (not illustrated) that covers the metal foils 61, 62 is formed so that the lower surface of the metal foil 61 and the metal foil 62 are not removed by etching, and the etching processing is performed using the resist layer as the etching mask. One part of the side surface of the projection 62A may be removed by the side etch phenomenon, and the opening diameter of the opening 62X may be widened. According to the step of FIG. 3E, the recess 61Y is formed as the recess 22Y illustrated in FIG. 1A, the opening 62X is formed as the opening 23X illustrated in FIG. 1A, and the projection 62A is formed as the projection 23D illustrated in FIG. 1A.

Figure 4A:
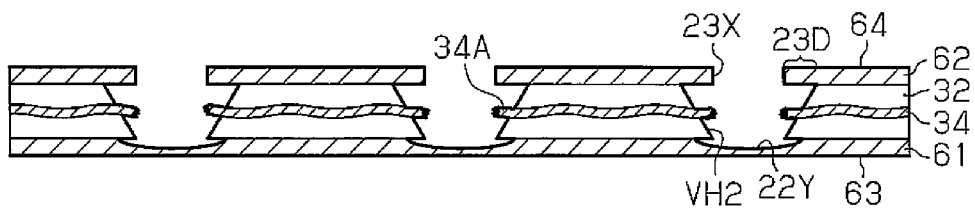

In the step illustrated in FIG. 4A, a seed layer 63 is formed to cover the entire lower surface of the metal foil 61. Further, a seed layer 64 is formed to cover the entire surface of the insulating layer 32 and the metal foil 62 together with the inner surfaces of the opening 23X, the through hole VH2, and the recess 22Y. The seed layers 63, 64 may be formed by electroless plating method, for example. The seed layer 63 is used as the base material of the metal film 42A and the metal film 23B, and the seed layer 64 is used as the base material of metal film 22B. Therefore, copper or copper alloy, for example, may be used as the material of the seed layers 63, 64.

Figure 4B:
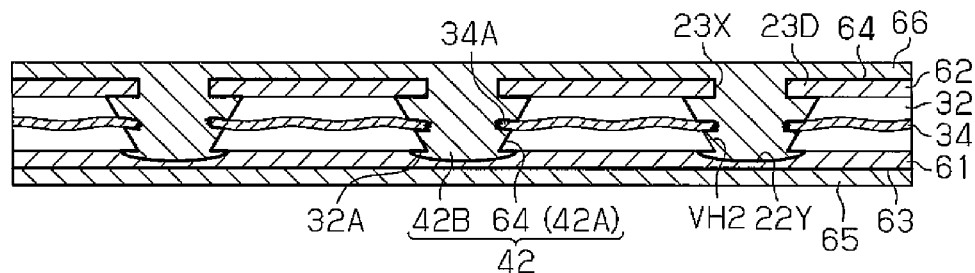

In the step illustrated in FIG. 4B, the electrolytic plating method using the seed layers 63, 64 as the plating power supplying layers is performed. This forms a conductive layer 65 covering the entire lower surface of the seed layer 63, the conductive layer 42B filled in the recess 22Y, the through hole VH2, and the opening 23X, and a conductive layer 66 covering the seed layer 64. When forming the conductive layer 42B, the plating is preferentially deposited on the projection 23D of the metal foil 62. Thus, a lid plating that closes the opening 23X is formed before the conductive layer 42B is completely filled in the through hole VH2. The plating is then deposited and grown at the upper side of the lid plating. The conductive layer 66 is formed by the lid plating and the plated film that covers the upper surface of the seed layer 64. Therefore, even when an aspect ratio (depth/diameter) of the through hole VH2 is large, the lid plating preferentially formed in the opening 23X may suitably suppress the generation of a recess at the upper surface of the via 42 and the upper surface of the conductive layer 66. As a result, the upper surface of the conductive layer 66 may be formed flat. In other words, the planarity of the upper surface of the conductive layer 66 may be enhanced. Further, in addition to the side surface of the projection 23D, the seed layer 64 is also formed on the entire inner surfaces of the recess 22Y, the through hole VH2, and the opening 23X, and the lower surface 32A of the insulating layer 32 exposed in the recess 22Y. Therefore, the plating is uniformly deposited and grown from the seed layer 64 in the recess 22Y and the through hole VH2. Thus, the variation of filling of the plated film in the recess 22Y, the through hole VH2, and the opening 23X may be suppressed. Furthermore, the plating is also deposited and grown from the seed layer 64 covering the entire surface of the end 34A of the glass cloth 34 that projects through the inner wall surface of the through hole VH2. Thus, the generation of void in the conductive layer 42B, that is, at the central part of the via 42 may be suitably suppressed. The end 34A of the glass cloth 34 has a rougher surface than the resin portion (inner wall surface of the through hole VH2, i.e., insulating layer 32), and thus has a large area. Thus, the amount in which a plating promoter used in the electrolytic plating method is adsorbed to the end 34A of the glass cloth 34 becomes greater than the amount adsorbed to the resin portion (insulating layer 32). Thus, the plating deposition speed in the through hole VH2 rises. In other words, the plating is deposited and grown preferentially on the end 34A of the glass cloth 34 than the inner wall surface of the through hole VH2. Therefore, the plating is appropriately formed at the central portion of the through hole VH2 where the void easily generates. Thus, even when the lid plating described above is formed, the void may be suitably suppressed from generating in the conductive layer 42B, that is, at the central part of the via 42.

In this manner, in the step illustrated in FIG. 4B, the seed layer 64 (i.e., metal film 42A) that covers the side surface and the lower surface of the projection 23D, the inner wall surface of the through hole VH2, the end 34A of the glass cloth 34, the lower surface 32A of the insulating layer 32 exposed in the recess 22Y, and the inner surface of the recess 22Y is formed. Further, the conductive layer 42B filled in the opening 23X, the through hole VH2, and the recess 22Y is formed. The seed layer 64 and the conductive layer 42B form the via 42. The conductive layer 66 that covers the entire upper surface of the conductive layer 42B and the entire upper surface of the seed layer 64 is formed.

Figure 4C:
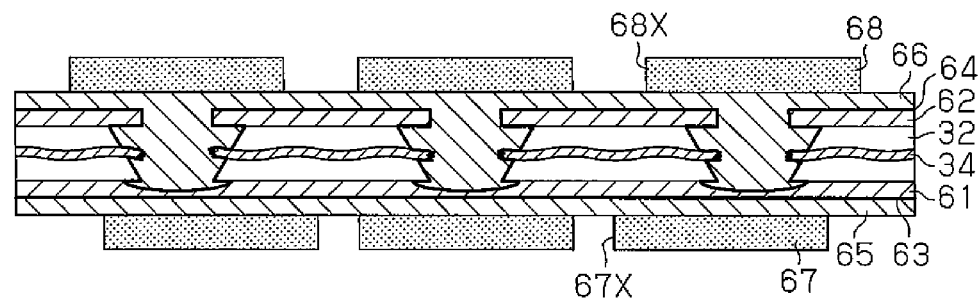

In the step illustrated in FIG. 4C, a resist layer 67 including an opening 67X at a given area is formed on the lower surface of the conductive layer 65. Further, a resist layer 68 including an opening 68X at a given area is formed on the upper surface of the conductive layer 66. The resist layer 67 covers the conductive layer 65 at a position corresponding to the wiring layer 22 illustrated in FIG. 1A. The resist layer 68 covers the conductive layer 66 at a position corresponding to the wiring layer 23 illustrated in FIG. 1A. In view of the etching processing performed in the next step, a material having etching resistance property may be used for the material of the resist layers 67, 68. For example, the material of the resist layers 67, 68 may be, for example, photosensitive dry film resist or liquid photoresist (e.g., dry film resist or liquid resist such as novolac resin, acrylic resin, and the like). When using the photosensitive dry film resist, the dry film is laminated on the lower surface of the conductive layer 65 and the upper surface of the conductive layer 66 through thermo-compression, and the laminated dry film is patterned through exposure and development. This forms the resist layer 67 having the opening 67X on the lower surface of the conductive layer 65, and forms the resist layer 68 having the opening 68X on the upper surface of the conductive layer 66. When using the liquid photoresist as well, the resist layers 67, 68 may be formed through similar steps.

Figure 4D:
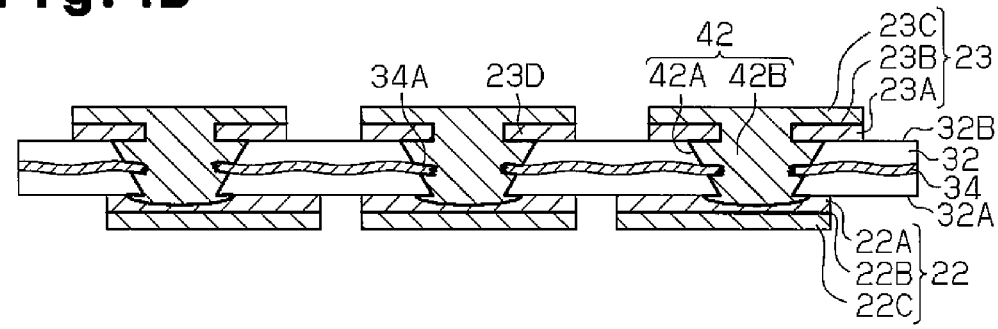

In the step illustrated in FIG. 4D, the conductive layers 65, 66, the seed layers 63, 64, and the metal foils 61, 62 are etched using the resist layers 67, 68 as the etching masks. This patterns the conductive layer 65, the seed layer 63, and the metal foil 61 exposed from the opening 67X of the resist layer 67 to a desired shape. Furthermore, the conductive layer 66, the seed layer 64, and the metal foil 62 exposed from the opening 68X of the resist layer 68 are pattered to a desired shape. As a result, the metal foil 22A patterned from the metal foil 61, the metal film 22B patterned from the seed layer 63, and the wiring pattern 22C patterned from the conductive layer 65 are stacked in order on the lower surface 32A of the insulating layer 32 to form the wiring layer 22. Furthermore, the metal foil 23A patterned from the metal foil 62, the metal film 23B patterned from the seed layer 64, and the wiring pattern 23C patterned from the conductive layer 66 are stacked in order on the upper surface 32B of the insulating layer 32 to form the wiring layer 23. Thereafter, the resist layers 67, 68 illustrated in FIG. 4C are removed with alkaline stripping solution, for example. In the present example, the wiring layers 22, 23 are simultaneously formed using the subtractive method. The method for forming the via 42 and the wiring layers 22, 23 is not limited to the subtractive method, and other wiring forming methods such as semi-additive method, and the like may be adopted.

Next, the roughening processing is performed on the wiring layers 22, 23. The roughening processing is performed so that the roughness degree of the surface of the wiring layers 22, 23 becomes about 0.5 to 2 μm in surface roughness value Ra, for example. The surface roughness value Ra is an index representing the surface roughness, and is called an arithmetic average roughness. The surface roughness value Ra is obtained by measuring the absolute value of the height that changes within the measurement region from the surface of the average height and by taking the arithmetic average of the measurement values. The lower surface and the side surface of the wiring layer 22 are roughened by the roughening processing, so that fine bumps are formed on the lower surface and the side surface of the wiring layer 22. Similarly, the upper surface and the side surface of the wiring layer 23 are roughened by the roughening processing, so that fine bumps are formed on the lower surface and the side surface of the wiring layer 23. In the next step illustrated in FIG. 5A, the roughening processing is performed to enhance the adhesiveness of the insulating layer 31 with respect to the wiring layer 22, and the adhesiveness of the insulating layer 33 with respect to the wiring layer 23. The roughening processing may be performed, for example, by etching processing, CZ processing, blackening processing (oxidation treatment), sandblast processing, and the like.

Figure 5A:
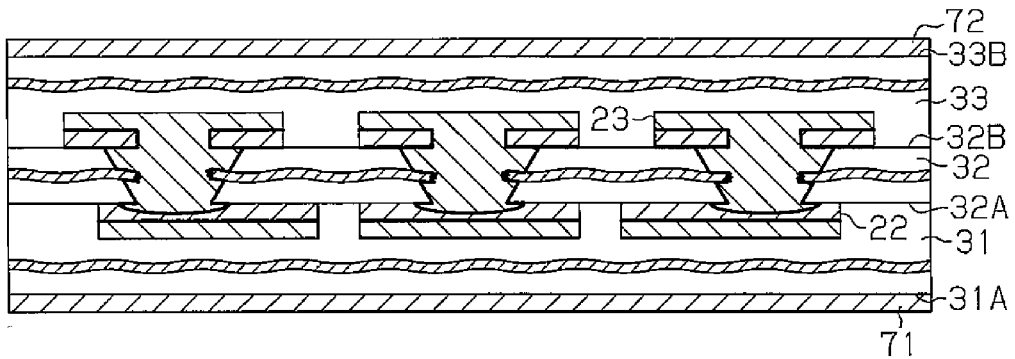

Then, in the step illustrated in FIG. 5A, the insulating layer 31 that covers the wiring layer 22 is stacked on the lower surface 32A of the insulating layer 32, and a metal foil 71 is stacked on the lower surface 31A of the insulating layer 31. The metal foil 71 is used as the base material of the metal foil 21A. The insulating layer 33 that covers the wiring layer 23 is stacked on the upper surface 32B of the insulating layer 32, and a metal foil 72 is stacked on the upper surface 33B of the insulating layer 33. The metal foil 72 is used as the base material of the metal foil 24A. Copper or copper alloy, for example, may be used for the material of the metal foils 71, 72. For example, a prepreg of semi-cured state obtained by impregnating the thermosetting insulating resin such as epoxy resin in the reinforcement material such as glass cloth, and the like is prepared. The prepreg and the metal foil 71 are stacked in order on the lower surface 32A of the insulating layer 32 of the structural body illustrated in FIG. 4D. Similarly, the prepreg and the metal foil 72 are stacked in order on the upper surface 32B of the insulating layer 32. Then, the structural body, the prepreg, and the metal foils 71, 72 are then pressurized from above and below at a temperature of about 190 to 200° C. in a vacuum atmosphere. The wiring layer 22 is thereby press-fitted into the prepreg arranged on the lower surface 32A of the insulating layer 32 and such prepreg is cured, so that the insulating layer 31 is obtained as the insulating resin layer containing a reinforcement material such as glass epoxy resin, and the like. The wiring layer 22 is adhered to the insulating layer 31 and the metal foil 71 is adhered to the lower surface 31A of the insulating layer 31 with the curing of the prepreg. Similarly, the wiring layer 23 is press-fitted into the prepreg arranged on the upper surface 32B of the insulating layer 32 and such prepreg is cured, so that the insulating layer 33 is obtained as the insulating resin layer containing a reinforcement material such as glass epoxy resin, and the like. The wiring layer 23 is adhered to the insulating layer 33 and the metal foil 72 is adhered to the upper surface 33B of the insulating layer 33 with the curing of the prepreg.

The pre-processing of the laser processing is then performed on the metal foils 71, 72. In this step, the roughening processing, the blackening processing, and the like are performed on the metal foils 71, 72, for example.

Figure 5B:
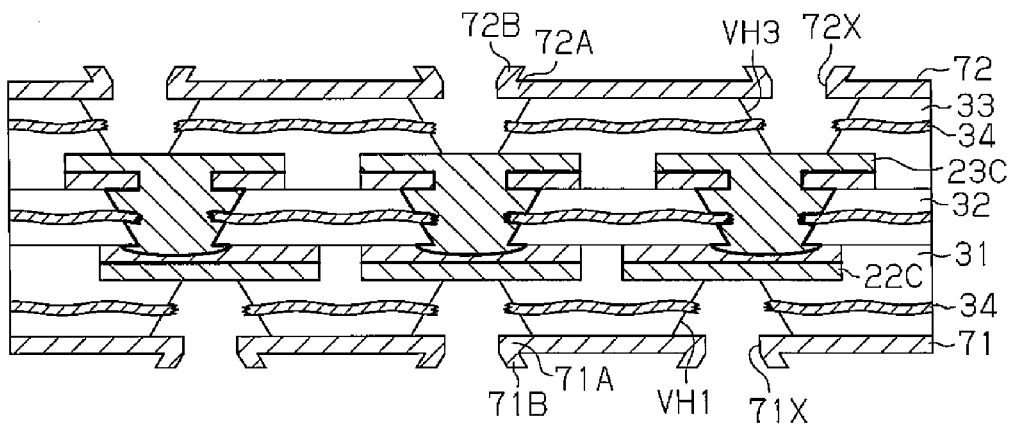

In the step illustrated in FIG. 5B, an opening 71X is formed in the metal foil 71 and the through hole VH1 that extends through the insulating layer 31 in the thickness direction is formed using the laser processing method. The through hole VH1 communicates with the opening 71X and exposes the lower surface of the wiring pattern 22C. In this case, the through hole VH1 extends from the opening 71X to the upper surface of the metal foil 71. Therefore, the metal foil 71 projects to the inner side of the through hole VH1 in a ring shape and thereby forms a projection 71A. That is, an overhang structure of the metal foil 71 is formed below the through hole VH1. In the same manner, the opening 72X is formed in the metal foil 72 and the through hole VH3 that extends through the insulating layer 33 in the thickness direction is formed using the laser processing method. The through hole VH3 communicates with the opening 72X and exposes the upper surface of the wiring pattern 23C. In this case, the through hole VH3 extends from the opening 72X to the lower surface of the metal foil 72. The copper sublimated by laser reattaches to the metal foil 71 (projection 71A) in the vicinity of the opening 71X and thereby forms a burr 71B. Similarly, the copper sublimated by laser reattaches to the metal foil 72 (projection 72A) in the vicinity of the opening 72X and thereby forms a burr 72B.

Figure 5C:
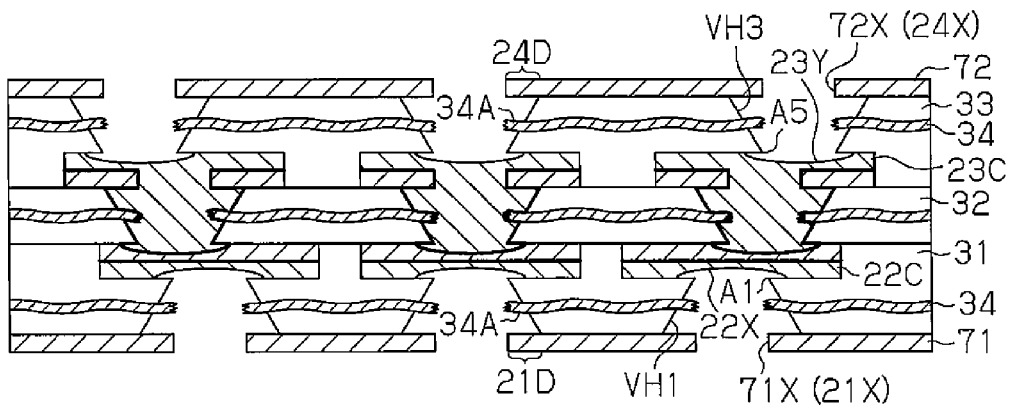

The manufacturing steps similar to the steps illustrated in FIG. 3C to FIG. 3E are then performed on the upper and lower surfaces of the structural body illustrated in FIG. 5B. First, the burrs 71B, 72B are removed by etching. The desmear processing is then performed to remove the resin smear of the through holes VH1, VH3 and to etch the inner walls of the insulating layers 31, 33 defining the inner wall surfaces of the through holes VH1, VH3. The opening diameters of the through holes VH1, VH3 thereby widen as illustrated in FIG. 5C. This increases the projection amounts of the projections 71A, 72A, as well as the projection amount of the glass cloth 34 projecting to the inner side through the inner wall surfaces of the through holes VH1, VH3. Next, the recess 22X that communicates with the through hole VH1 and has an opening diameter greater than the open end A1 of the through hole VH1 is formed at the lower surface of the wiring pattern 22C. Further, the recess 23Y that communicates with the through hole VH3 and has an opening diameter greater than the open end A5 of the through hole VH3 is formed at the upper surface of the wiring pattern 23C. According to such steps, the openings 71X, 72X are formed as openings 21X, 24X illustrated in FIG. 1B, respectively, and the projections 71A, 72A are formed as projections 21D, 24D illustrated in FIG. 1B, respectively.

Figure 6A:
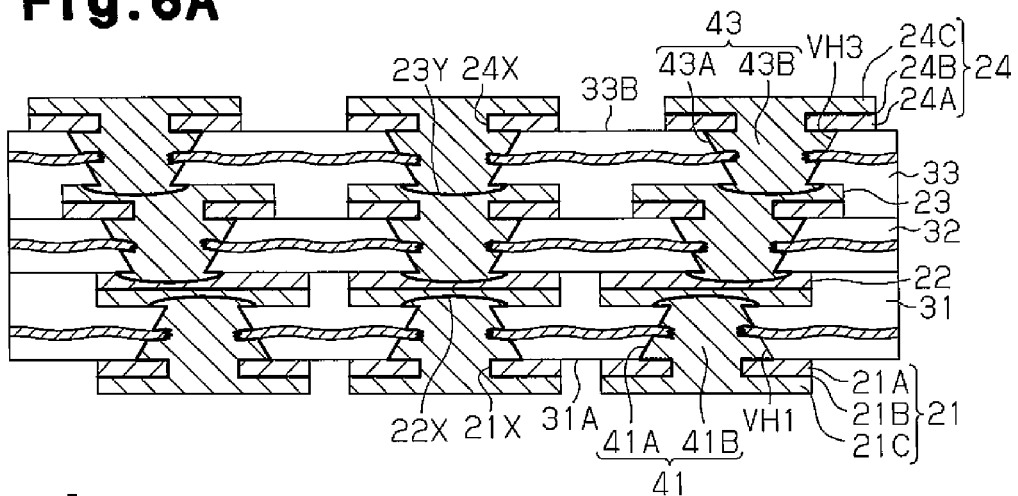

The manufacturing steps similar to the steps illustrated in FIG. 4A to FIG. 4D are then performed on the upper and lower surfaces of the structural body illustrated in FIG. 5C. As illustrated in FIG. 6A, the via 41 to be filled in the opening 21X, the through hole VH1, and the recess 22X, and the via 43 to be filled in the opening 24X, the through hole VH3, and the recess 23Y are formed. The metal foil 21A patterned to a desired shape from the metal foil 71, the metal film 21B that covers the entire lower surface of the metal foil 21A, and the wiring pattern 21C that covers the entire lower surfaces of the metal film 21B and the via 41 are stacked in order on the lower surface 31A of the insulating layer 31 to form the wiring layer 21. Further, the metal foil 24A patterned to a desired shape from the metal foil 72, the metal film 24B that covers the entire upper surface of the metal foil 24A, and the wiring pattern 24C that covers the entire upper surfaces of the metal film 24B and the via 43 are stacked in order on the upper surface 33B of the insulating layer 33 to form the wiring layer 24.

Figure 6B:
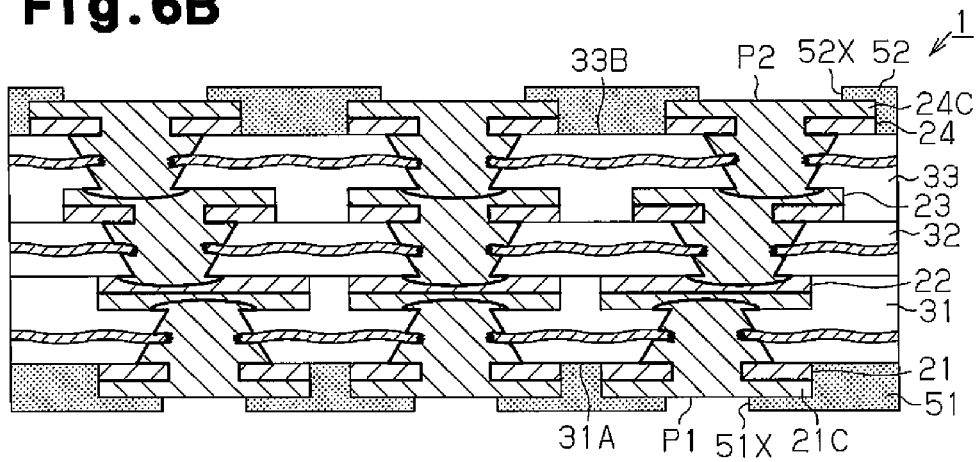

In the step illustrated in FIG. 6B, the solder resist layer 51 including the opening 51X for exposing a given area of the wiring layer 21 as the pad P1 is formed on the lower surface 31A of the insulating layer 31. The solder resist layer 52 including the opening 52X for exposing a given area of the wiring layer 24 as the external connection pad P2 is formed on the upper surface 33B of the insulating layer 33. The solder resist layers 51, 52 are formed by laminating a photosensitive solder resist film or applying a liquid solder resist, and patterning the resist to the given shape, for example. A part of the wiring layer 21 is thereby exposed from the opening 51X of the solder resist layer 51 as the pad P1, and a part of the wiring layer 24 is exposed from the opening 52X of the solder resist layer 52 as the external connection pad P2. For example, the metal layer in which the Ni layer and the Au layer are stacked in such order may be arranged on the pad P1 and the external connection pad P2, as necessary. The metal layer may be formed by electroless plating method, for example. The wiring substrate 1 illustrated in FIG. 1A may be manufactured according to the manufacturing steps described above.

The method for manufacturing the semiconductor device 2 will now be described.

Figure 6C:
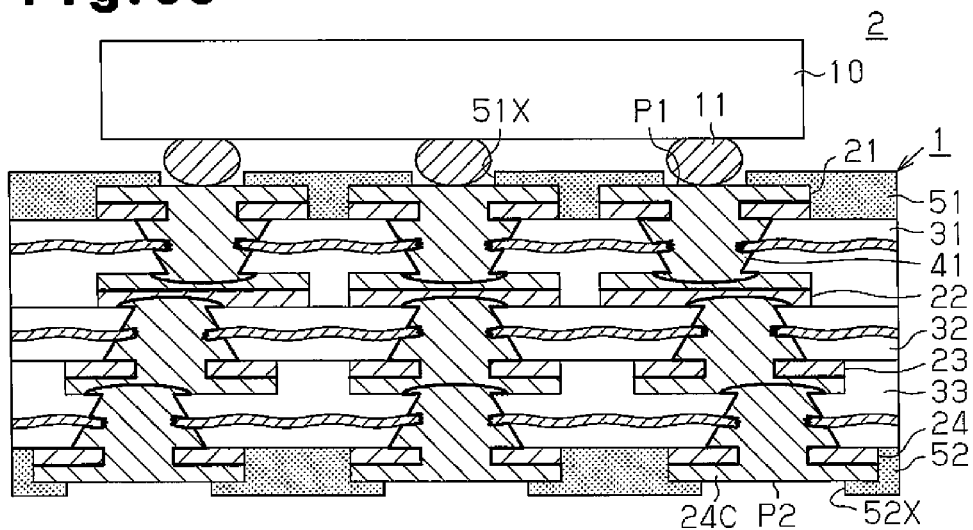
Figure 7A:
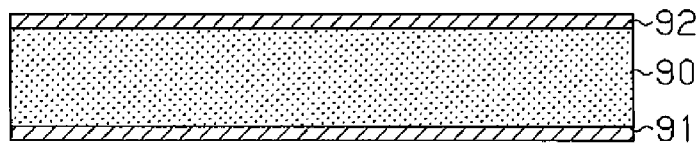
FIGS. 7A to 7F are schematic cross-sectional views illustrating a method for manufacturing the wiring substrate in the related art.
Figure 7B:
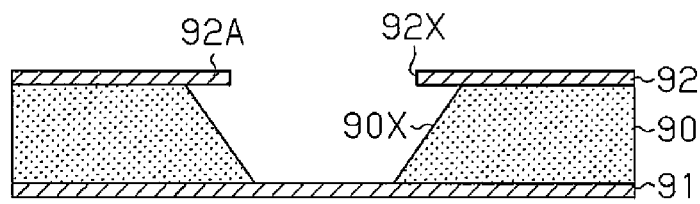
Figure 7C:
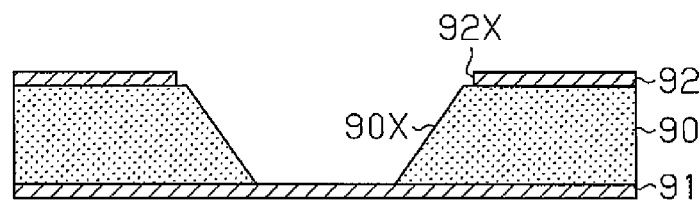
Figure 7D:
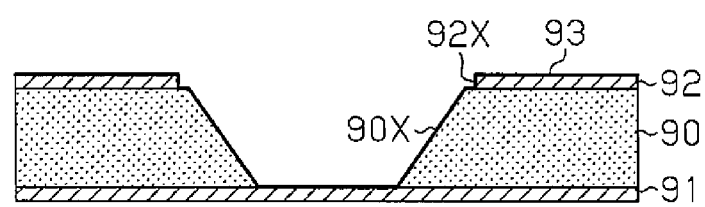
Figure 7E:
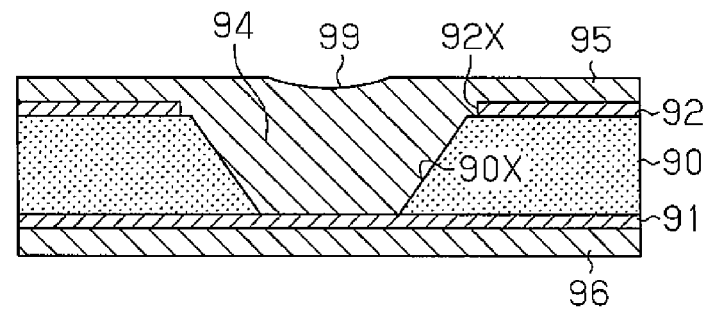
Figure 7F:
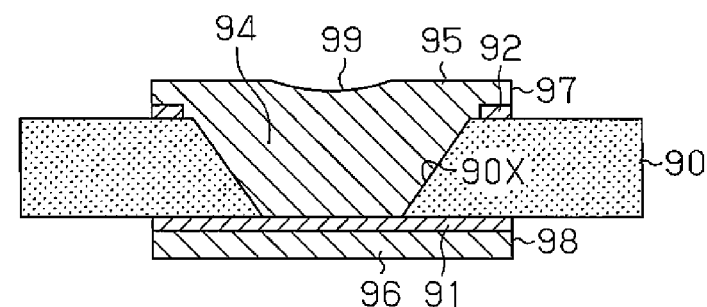

In the step illustrated in FIG. 6C, the semiconductor chip 10 is first mounted on the wiring substrate 1 manufactured as described above. In the present example, the bump 11 of the semiconductor chip 10 is flip-chip joined to the pad P1 of the wiring substrate 1. Then, the underfill resin 13 (see FIG. 2) is filled between the flip-chip joined wiring substrate 1 and semiconductor chip 10, and the underfill resin 13 is cured. The manufacturing device 2 illustrated in FIG. 2 may be manufactured according to such manufacturing steps.

The present embodiment has the advantages described below.

(1) The projection 23D projecting to the inner side from the open end A4 above the through hole VH2 is formed on the metal foil 23A. In other words, the opening 23X that communicates with the through hole VH2 and has an opening diameter smaller than the opening diameter of the open end A4 is formed in the metal foil 23A. The via 42 is formed in the space including the through hole VH2 and the opening 23X. The space is defined by the step formed by the side surface and the lower surface of the projection 23D and the inner wall surface of the through hole VH2. Therefore, the via 42 filled in the through hole VH2 extends to the lower surface of the projection 23D. This enhances the adhesiveness of the via 42 and the insulating layer 32. As a result, high adhesiveness may be maintained with respect to the tension force occurred by the difference in thermal expansion coefficient of the via 42 and the insulating layer 32. Accordingly, the via 42 may be suppressed from falling out from the through hole VH2.

(2) The via 42 and the conductive layer 66 are formed by performing the electrolytic plating in a state in which the projection 62A (23D) of the metal foil 62 projecting to the inner side from the open end A4 above the through hole VH2 remained. Thus, the plating is preferentially deposited on the projection 23D. As a result, the lid plating that closes the opening 23X is formed before the conductive layer 42B is completely filled in the through hole VH2. Therefore, even when the aspect ratio of the through hole VH2 is large, the lid plating preferentially formed in the opening 23X may suitably suppress the generation of a recess at the upper surface of the via 42 and the upper surface of the conductive layer 66. Accordingly, the flatness of the upper surfaces of the via 42 and the conductive layer 66 may be enhanced.

With the enhancement of the flatness of the upper surfaces of the via 42 and the conductive layer 66 (wiring pattern 23C), the filling property of the plating of the via 43 is enhanced when stacking the via 43 on the via 42. Thus, compared to when the undesired recess is formed at the upper surface of the via 42, the upper surface of the via 43 stacked on the via 42 is formed flat. Furthermore, the connection reliability between the vias 42, 43 is enhanced.

(3) The via 42 covers the entire surface of the end 34A of the glass cloth 34 that projects through the inner wall surface of the through hole VH2. In other words, the end 34A of the glass cloth 34 projecting into the via 42 from the inner wall surface of the through hole VH2. Thus, the tensile strength of the via 42 becomes high. This may enhance the connection reliability of the via 42 and the insulating layer 32.

(4) The conductive layer 42B is filled in the through hole VH2 in a state in which the end 34A of the glass cloth 34 projecting through the inner wall surface of the through hole VH2. Thus, the plated film is preferentially deposited and grown from the seed layer 64 formed over the entire surface of the end 34A of the glass cloth 34 projecting out from the inner wall surface of the through hole VH2. This may suitably suppress the generation of the void at the central part of the conductive layer 42B.

(5) The via 42 joined to the upper surface of the wiring layer 22 is filled in the through hole VH2 and the recess 22Y having an opening diameter greater than the open end A3 of the through hole VH2. Therefore, the bottom B2 of the via 42 extends to the lower surface 32A of the insulating layer 32. In other words, a part of the lower surface 32A of the insulating layer 32 extends to the recess 22Y since the opening diameter of the recess 22Y is greater than the opening diameter of the open end A3 of the through hole VH2. This increases the contacting area of the via 42 filled in the recess 22Y and the insulating layer 32. Thus, the adhesiveness of the via 42 and the insulating layer 32 is enhanced. As a result, high adhesiveness may be maintained with respect to the tension force occurred by the difference in thermal expansion coefficient of the via 42 and the insulating layer 32. Accordingly, the via 42 may be suppressed from falling out from the through hole VH2.

(6) The via 41 joined to the lower surface of the wiring layer 22 is filled to the through hole VH1 and the recess 22X having an opening diameter greater than the open end A1 of the through hole VH1. Therefore, the bottom B1 of the via 41 extends to the upper surface of the insulating layer 31 exposed in the recess 22X. In other words, a part of the upper surface of the insulating layer 31 is formed in the recess 22X since the opening diameter of the recess 22X is greater than the opening diameter of the open end A1 of the through hole VH1. This increases the contacting area of the via 41 filled in the recess 22X and the insulating layer 31 increases. Thus, the adhesiveness of the via 41 and the insulating layer 31 is enhanced. As a result, high adhesiveness may be maintained with respect to the tension force occurred by the difference in thermal expansion coefficient of the via 41 and the insulating layer 31. Accordingly, the via 41 may be suppressed from falling out from the through hole VH1.

(7) The bottom B2 of the via 42 is joined to the upper surface of the wiring layer 22, and the bottom B1 of the via 41 is joined to the lower surface of the wiring layer 22. This thins the wiring substrate 1. Furthermore, the recess 22X filled with the bottom B1 of the via 41 is formed at the lower surface of the wiring pattern 22C formed on the lower surface of the metal film 22B, whereas the recess 22Y filled with the bottom B2 of the via 42 is formed at the upper surface of the metal foil 22A formed on the upper surface of the metal film 22B. In other words, the metal film 22B is interposed between the recess 22X and the recess 22Y. Therefore, the recess 22X does not contact nor communicate with the recess 22Y. That is, the contacting interface between the recess 22X, 22Y does not exist in the wiring layer 22. This may suppress cracks that would be generated by the contacting interface between the recesses 22X, 22Y. Accordingly, the connection reliability of the vias 41, 42 and the wiring layer 22 may be enhanced.

The recess 22X is formed in the wiring pattern 22C and the recess 22Y is formed in the metal foil 22A. Thus, the wiring layer 22 is easily formed at a thickness the recess 22X does not contact or communicate with the recess 22Y. This may suppress the cracks that would be generated by the contacting interface. Therefore, the connection reliability of the vias 41, 42 and the wiring layer 22 may be easily enhanced.

(8) The through holes VH1, VH2 are formed so that the diameter reduces toward the wiring layer 22. Thus, the tolerable amount with respect to the positional shift of the through holes VH1, VH2 may be increased.

(9) Each of the insulating layers 31 to 33 to be stacked is an insulating resin layer containing a reinforcement material. Therefore, each insulating layer 31 to 33 has high mechanical strength. This may effectively reduce the warp of the wiring substrate 1.

It should be apparent to those skilled in the art that the present invention may be embodied in many other specific forms without departing from the spirit or scope of the invention. Particularly, it should be understood that the present invention may be embodied in the following forms.

In the embodiment described above, each insulating layer 31 to 33 is an insulating resin layer containing a reinforcement material, but the insulating layers 31, 33 may be resin layers formed from other materials when the insulating layer 32 is the insulating resin layer containing the reinforcement material. For example, the insulating layers 31, 33 may not contain the reinforcement material. In this case, an insulating resin such as epoxy resin, polyimide resin, and the like, for example, may be used as the material of the insulating layers 31, 33. In this case, the thickness of the insulating layers 31, 33 may be about 20 to 30 µm, for example. In such structure, the insulating layers 31, 33 may be formed thin. The wiring substrate 1 thus may be thinned.

In the embodiment described above, the manufacturing method of when manufacturing a single wiring substrate has been described, but the manufacturing method may be applied to when manufacturing a plurality of wiring substrates.

In the wiring substrate 1 of the embodiment described above, the surface formed with the pad P1 is used as the chip mounting surface. However, the surface formed with the external connection pad P2, for example, may be used as the chip mounting surface.

In the embodiment described above, the semiconductor chip 10 is mounted on the wiring substrate 1. However, the mounting component is not limited to the semiconductor chip 10. For example, the present invention may be applied even to a package-on-package having a structure in which another wiring substrate is stacked on the wiring substrate 1.

The number of layers and the drawing of wiring of the wiring layers 21 to 24 and the insulating layers 31 to 33 in the wiring substrate 1 in the embodiment described above, or the mounting mode (e.g., flip-chip mounting, wire bonding mounting, or combination thereof) of the semiconductor chip 10, and the like may be variously changed and modified.

CLAUSES

This disclosure further encompasses various embodiments described below.

1. A method for manufacturing a wiring substrate, the method comprising:

forming a first metal foil on a lower surface of a first insulating layer;

forming a second metal foil on an upper surface of the first insulating layer;

forming a first opening in the second metal foil and a first through hole that extends through the first insulating layer by performing laser processing, the first through hole communicating with the first opening and exposing an upper surface of the first metal foil, the first through hole including a first open end facing the first metal foil and a second open end located at an opposite side of the first open end, wherein the first opening is formed such that a part of the second metal foil is formed as a first projection that projects to an inner side from the second open end above the first through hole;

forming a first recess in the upper surface of the first metal foil, the first recess communicating with the first through hole and having an opening diameter greater than an opening diameter of the first open end of the first through hole;

forming a first seed layer that covers a lower surface of the first metal foil;

forming a second seed layer that covers a side surface and a lower surface of the first projection, an upper surface of the second metal foil, an inner wall surface of the first through hole, and an inner surface of the first recess;

forming a first wiring layer, the first wiring layer including the first metal foil patterned to a desired shape, a first metal film obtained by patterning the first seed layer to cover the entire lower surface of the first metal foil, and a first wiring pattern formed by performing electrolytic plating using the first seed layer as a power supplying layer to cover an entire lower surface of the first metal film;

forming a first via by performing electrolytic plating using the second seed layer as a power supplying layer, the first via being filled in the first opening, the first through hole, and the first recess;

forming a second wiring layer on the first insulating layer, the second wiring layer being electrically connected with the first via and including the second metal foil patterned to a desired shape, a second metal film obtained by patterning the second seed layer to cover the entire upper surface of the second metal foil, and a second wiring pattern formed by performing the electrolytic plating using the second seed layer to cover an entire upper surface of the second metal film;

stacking a second insulating layer, which covers the first wiring layer, on the lower surface of the first insulating layer;

stacking a third metal foil on a lower surface of the second insulating layer;

forming a second opening in the third metal foil and a second through hole that extends through the second insulating layer by performing laser processing, the second through hole communicating with the second opening and exposing a lower surface of the first wiring pattern, the second through hole including a third open end facing the first wiring pattern and a fourth open end located at an opposite side of the third open end, wherein the second opening is formed such that a part of the third metal foil is formed as a second projection that projects to an inner side from the fourth open end below the second through hole;

forming a second recess in the lower surface of the first wiring pattern, the second recess communicating with the second through hole and having an opening diameter greater than an opening diameter of the third open end of the second through hole;

forming a third seed layer that covers a side surface and a lower surface of the second projection, a lower surface of the third metal foil, an inner wall surface of the second through hole, and an inner surface of the second recess;

forming a second via by performing electrolytic plating using the third seed layer as a power supplying layer, the second via being filled in the second opening, the second through hole, and the second recess; and forming a third wiring layer on the lower surface of the second insulating layer, the third wiring layer being electrically connected with the second via and including the third metal foil patterned to a desired shape, a third metal film obtained by patterning the third seed layer to cover the entire lower surface of the third metal foil, and a third wiring pattern formed by performing electrolytic plating using the third seed layer as a power supplying layer to cover an entire lower surface of the third metal film.

2. The method according to clause 1, further comprising:

stacking a third insulating layer, which covers the second wiring layer, on the upper surface of the first insulating layer;

stacking a fourth metal foil on an upper surface of the third insulating layer;

forming a third opening in the fourth metal foil and a third through hole that extends through the third insulating layer by performing laser processing, the third through hole communicating with the third opening and exposing an upper surface of the second wiring layer, the third through hole including a fifth open end facing the second wiring layer and a sixth open end located at an opposite side of the fifth open end, wherein the third opening is formed such that a part of the fourth metal foil is formed as a third projection that projects to an inner side from the sixth open end above the third through hole;

forming a third recess in the upper surface of the second wiring layer, the third recess communicating with the third through hole and having an opening diameter greater than an opening diameter of the fifth open end of the third through hole;

forming a third via filled in the third opening, the third through hole, and the third recess; and forming a fourth wiring layer on the upper surface of the third insulating layer, the fourth wiring layer including the fourth metal foil patterned to a desired shape, the fourth wiring layer being electrically connected with the third via.

3. The method according to clause 2, wherein the first insulating layer is formed from an insulating resin containing a first reinforcement material, the second insulating layer is formed from an insulating resin containing a second reinforcement material, the third insulating layer is formed from an insulating resin containing a third reinforcement material, the first via is arranged to cover an entire surface of an end of the first reinforcement material projecting through an inner wall surface of the first through hole, the second via is arranged to cover an entire surface of an end of the second reinforcement material projecting through an inner wall surface of the second through hole, and the third via is arranged to cover an entire surface of an end of the third reinforcement material projecting through an inner wall surface of the third through hole.

4. The method according to clause 3, further comprising:

removing a burr generated when forming the first projection by the laser processing; and performing desmear processing to remove a resin smear in the first through hole and to etch the inner wall surface of the first through hole so that a projection amount of the first projection from the second open end of the first through hole and a projection amount of the first reinforcement material from the inner wall surface of the first through hole are increased.

The present examples and embodiments are to be considered as illustrative and not restrictive, and the invention is not to be limited to the details given herein, but may be modified within the scope and equivalence of the appended claims.

The invention claimed is:

1. A wiring substrate comprising:

a first wiring layer, the first wiring layer including a first wiring pattern, a metal film that covers an entire upper surface of the first wiring pattern, and a first metal foil that covers an entire upper surface of the metal film;

a first insulating layer arranged on an upper surface of the first metal foil and including a first through hole, the first through hole including a first open end facing the first metal foil and a second open end located at an opposite side of the first open end, wherein an opening diameter of the first open end is smaller than an opening diameter of the second open end;

a second wiring layer arranged on an upper surface of the first insulating layer, the second wiring layer including a second metal foil and a second wiring pattern arranged on an upper surface of the second metal foil, the second metal foil including a first opening and a first projection, the first opening communicating with the first through hole and having an opening diameter smaller than the opening diameter of the second open end, and the first projection projecting toward an inner side from the second open end above the first through hole to define the first opening;

a second insulating layer arranged on a lower surface of the first insulating layer and including a second through hole, the second through hole including a third open end facing the first wiring pattern and a fourth open end located at an opposite side of the third open end, wherein an opening diameter of the third open end is smaller than an opening diameter of the fourth open end;

a third wiring layer arranged on a lower surface of the second insulating layer, the third wiring layer including a third metal foil and a third wiring pattern arranged on a lower surface of the third metal foil, the third metal foil including a second opening and a second projection, the second opening communicating with the second through hole and having an opening diameter smaller than the opening diameter of the fourth open end, and the second projection projecting toward an inner side from the fourth open end below the second through hole to define the second opening;

a first via that electrically connects the first wiring layer and the second wiring layer, the first via being filled in the first opening, the first through hole, and a first recess formed in the upper surface of the first metal foil, the first recess communicating with the first through hole and having an opening diameter greater than the opening diameter of the first open end; and a second via that electrically connects the first wiring layer and the third wiring layer, the second via being filled in the second opening, the second through hole, and a second recess formed in a lower surface of the first wiring pattern, the second recess communicating with the second through hole and having an opening diameter greater than the opening diameter of the third open end.

2. The wiring substrate according to claim 1, further comprising:

a third insulating layer arranged on the upper surface of the first insulating layer and including a third through hole, the third through hole including a fifth open end facing the second wiring pattern and a sixth open end located at an opposite side of the fifth open end, wherein an opening diameter of the fifth open end is smaller than an opening diameter of the sixth open end;

a fourth wiring layer arranged on an upper surface of the third insulating layer, the fourth wiring layer including a fourth metal foil and a fourth wiring pattern arranged on an upper surface of the fourth metal foil, the fourth metal foil including a third opening and a third projection, the third opening communicating with the third through hole and having an opening diameter smaller than the opening diameter of the sixth open end, and the third projection projecting toward an inner side from the sixth open end above the third through hole to define the third opening; and a third via that electrically connects the second wiring layer and the fourth wiring layer, the third via being filled in the third opening, the third through hole, and a third recess formed in an upper surface of the second wiring pattern, the third recess communicating with the third through hole and having an opening diameter greater than the opening diameter of the fifth open end.

3. The wiring substrate according to claim 1, wherein the first via includes a second metal film that covers an entire side surface and an entire lower surface of the first projection, an entire inner wall surface of the first through hole, and an entire inner surface of the first recess.

4. The wiring substrate according to claim 2, wherein
the first insulating layer is an insulating resin layer containing a first reinforcement material,
the second insulating layer is an insulating resin layer containing a second reinforcement material,
the third insulating layer is an insulating resin layer containing a third reinforcement material,
the first via is arranged to cover an entire surface of an end of the first reinforcement material projecting through an inner wall surface of the first through hole,
the second via is arranged to cover an entire surface of an end of the second reinforcement material projecting through an inner wall surface of the second through hole, and
the third via is arranged to cover an entire surface of an end of the third reinforcement material projecting through an inner wall surface of the third through hole.

* * * * *